May 12, 1964 E. G. MILLIS 3,133,278

ANALOGUE TO DIGITAL CONVERTER

Filed Aug. 13, 1958 5 Sheets-Sheet 1

INVENTOR
Edwin G. Millis
BY Stevens, Davis, Miller & Mosher
ATTORNEYS

May 12, 1964 E. G. MILLIS 3,133,278

ANALOGUE TO DIGITAL CONVERTER

Filed Aug. 13, 1958 5 Sheets-Sheet 2

INVENTOR

Edwin G. Millis

BY Stevens, Davis, Miller & Mosher

ATTORNEYS

INVENTOR
Edwin G. Millis

BY Stevens, Davis, Miller & Mosher
ATTORNEYS

May 12, 1964 E. G. MILLIS 3,133,278

ANALOGUE TO DIGITAL CONVERTER

Filed Aug. 13, 1958 5 Sheets-Sheet 4

INVENTOR

Edwin G. Millis

BY Stevens, Davis, Miller & Mosher

ATTORNEYS

INVENTOR
Edwin G. Millis
BY Stevens, Davis, Miller & Mosher
ATTORNEYS 3,133,278

ANALOGUE TO DIGITAL CONVERTER

Edwin G. Millis, Houston, Tex., assignor to Texas Instruments Incorporated, Dallas, Tex., a corporation of Delaware Filed Aug. 13, 1958, Ser. No. 754,742
4 Claims. (Cl. 340—347)

This invention relates to a new and improved system for converting an analogue voltage into a digital decimal number and for indicating the value of the digital number.

Prior to the present invention many systems were known for converting analogue values to digital values. Most of these systems of the prior art rely upon a large number of outputs in order to attain a wide range. The present invention, in contradistinction to the systems of the prior art, provides an automatic means to shift the decimal place in the digital number, and thus achieves a wide range with only a few outputs.

Most of the analogue to digital converters of the prior art convert to a binary number and are not adaptable for converting to decimal numbers or even to ternary numbers. In the preferred embodiment of the present invention, the conversion is made to decimal numbers. Due to its versatility, however, the invention is readily adaptable for conversion to binary, ternary, or any other digital system.

The present invention includes a novel comparison circuit which compares an input voltage to a standard voltage and produces an output voltage equal to the standard voltage when, and only when, the input voltage exceeds the standard voltage. The circuit permits precise comparison between the input voltage and the standard voltage.

The present invention also includes a novel amplifier circuit, or what might be called an attenuator circuit, which produces an output voltage equal to the input voltage or equal to a predetermined fraction thereof in dependence upon the application of a control signal to the amplifier.

Other features will be evident from the following brief description of the system of the present invention. The analogue input voltage to the system is applied through a series of amplifiers to the first one of three series of detectors. The first series of detectors compares the analogue voltage to a series of standard voltages having values varied from each other in equal voltage steps. As a result of this comparison, the first series of detectors detects the most significant digit of the value of the input voltage to the system and energizes a lamp to give a visual indication of the most significant digit. The first series of detectors also produces an output voltage equal to a selected standard voltage of the first series. This selected standard voltage is always the highest standard voltage of those which are less than the voltage applied to the first series of detectors. The difference between the output voltage from the first series of detectors and the voltage applied to the first series of detectors is amplified and applied to the second series of detectors. The second series of detectors, like the first, compares the applied voltage to its own series of standard voltages and detects the second most significant digit of the value of the input voltage to the system. A lamp is energized to indicate this second most significant digit. Like the first series, the second series of detectors produces an output voltage equal to a selected one of its standard voltages which is the highest one lower than the voltage applied to the second series. The difference between the output voltage from the second series and the voltage applied to the second series is amplified and applied to a third series of detectors. The third series, like the first and second series, compares the applied voltage with its series of standard voltages and detects the value of the third most significant digit of the input voltage to the system. A lamp is energized to indicate this third most significant digit of the input voltage.

The system is also provided with a means to shift automatically the decimal place of the indication to the right or the left depending on the value of the input voltage. The digital number to which the system converts the value of input voltage can have its decimal place in any one of a plurality of places, and thus a wide range for the system is achieved.

Other objects and advantages of the invention will become readily apparent as the following description of the preferred embodiment unfolds and when taken in conjunction with the drawings in which:

FIGURE 1 of the drawings is a block diagram of the system of the invention illustrating the operation of the system;

A preferred embodiment of the invention will now be described.

*Operation of the System*

Figure 1:
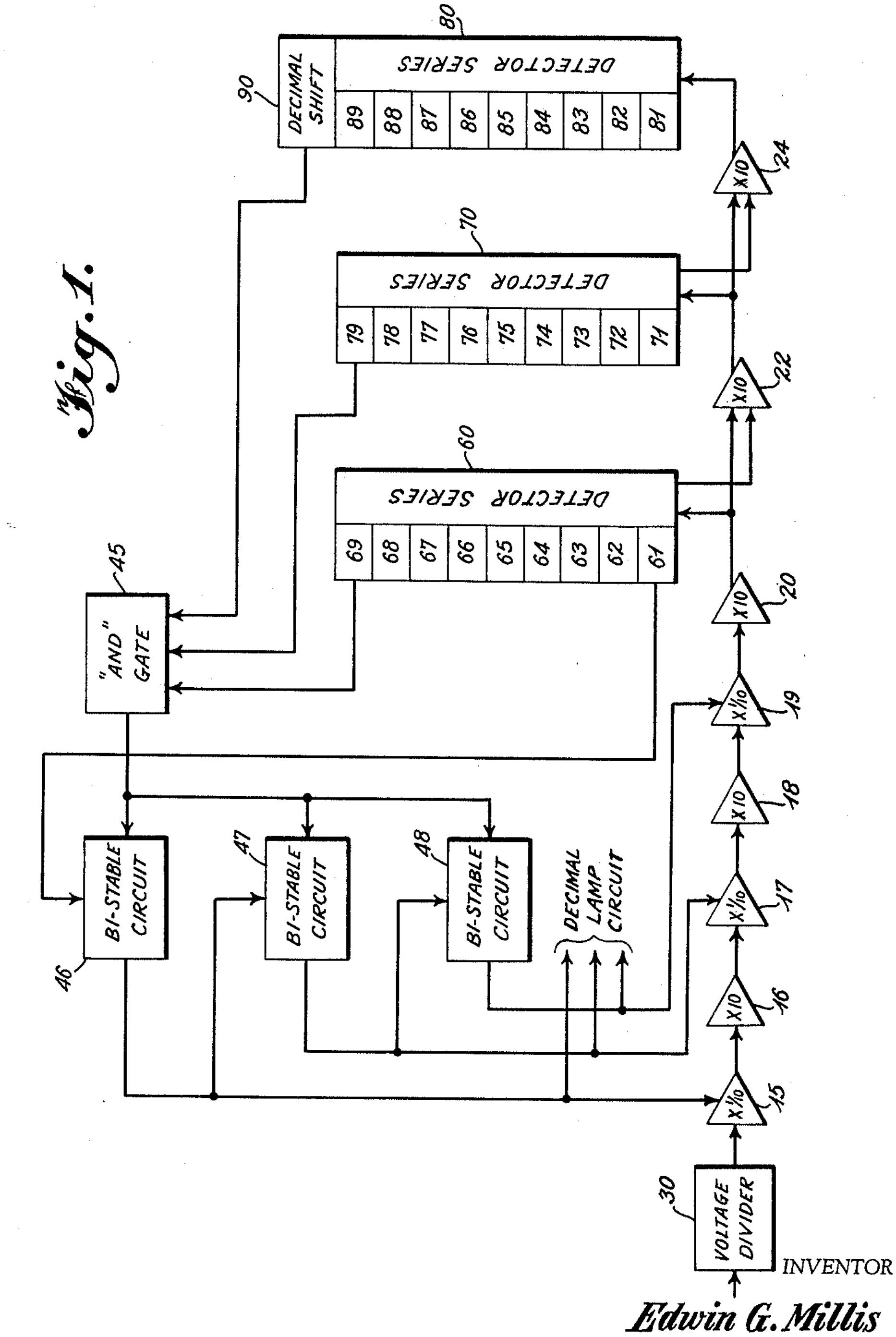

The operation of the system can be best understood with reference to the block diagram of FIGURE 1. A D.C. input signal voltage, the amplitude of which is to be converted into a digital decimal number, is applied to a voltage divider 30 which attenuates the amplitude of the input voltage by a factor of $33\frac{1}{3}$, or in other words multiplies it by a factor of $\frac{3}{100}$. The output from the voltage divider 30 is applied through a series of amplifiers 15 through 20. The amplifiers 15, 17 and 19 are designated $\times\frac{1}{10}$ because each attenuates an applied input signal by a factor of 10 when a control signal is applied thereto. With no control signal applied, each $\times\frac{1}{10}$ amplifier produces an output voltage equal to its input voltage. The amplifiers 16, 18 and 20 are designated $\times 10$ amplifiers because each amplifies an applied input voltage by a factor of 10.

The output from the $\times 10$ amplifier 20 is applied to a first detector series 60 to derive the first significant decimal digit of the input voltage applied to the voltage divider 30 and to cause a lamp to be energized to give a visual indication of the first significant digit.

The detector series 60 comprises nine detectors, 61 through 69, to indicate the numbers 1 through 9, respectively. Each of the detectors 61 through 69 has a different standard voltage for comparison with the voltage applied from the amplifier 20. These standard voltages range from 3 volts up to 27 volts in steps of 3 volts. The standard voltage for each detector is 3 times the digit that it indicates. For example, the detector 61, which indicates the number 1, has a standard voltage of 3 volts and the detector 62, which indicates the number 2, has a standard voltage of 6 volts.

Each detector of the detector series 60 compares the voltage applied from the amplifier 20 with its standard voltage. If the applied voltage is higher than the standard voltage of a particular detector, then that detector will be actuated. Each detector will remain actuated as long as the voltage applied from the amplifier 20 remains above the standard voltage of the detector and will become deactuated whenever the applied voltage falls below the standard voltage. Of those detectors actuated, the one having the highest standard voltage energizes a lamp to indicate the first significant digit of the input voltage applied to the voltage divider 30. For example, assume that all of the ×1/10 amplifiers have control signals applied thereto and an input voltage of 357 volts is applied to the voltage divider 30. The output from the voltage divider 30 will then be 10.71 volts. Since amplifiers 15, 17, and 19 each attenuate this voltage by a factor of 10 and amplifiers 16, 18, and 20 each amplify this voltage by a factor of 10, the voltage applied to the detector series 60 will be 10.71 volts. Since this voltage is higher than the standard voltages of 3, 6, and 9 volts, the detectors 61, 62, and 63 will be actuated. The detectors 63 will then energize its lamp, thus indicating that the first significant digit of the D.C. input signal voltage is 3.

The first detector series 60 also produces a D.C. output voltage equal to the highest standard voltage of the actuated detectors in the series 60. The output voltage is applied to an ×10 amplifier 22. In the example described above, this output voltage will be 9 volts. The output from the amplifier 20 is also applied to the amplifier 22. The amplifier 22 amplifies by a factor of 10 the voltage difference between the voltages applied from the amplifier 20 and from the detector series 60 and this amplified difference voltage is applied to a detector series 70.

The detector series 70 is identical to the detector series 60, and produces an indication of the second most significant digit of the input voltage to the system. It has nine detectors, 71 through 79, which indicate the numbers 1 through 9, respectively, with each having a different standard voltage, ranging from 3 volts to 27 volts, so that the standard voltage for each detector is three times the number that it indicates. The voltage applied to the series 70 from amplifier 22 will actuate those detectors of the series which have a standard voltage lower than the voltage applied from amplifier 22 and each actuated detector will remain actuated until the voltage applied from amplifier 22 drops below its respective standard voltage, at which time the respective detector will become deactuated. The actuated detector of the series 70 having the highest standard voltage will energize a lamp to indicate the second most significant digit of the input voltage to the system.

In the example described above, the voltage applied to amplifier 22 from amplifier 20 would be 10.71 volts and that applied from the detector series 60 would be 9 volts, the difference being 1.71 volts. When amplified by 10 by the amplifier 22, the voltage is 17.1 volts. This voltage, when applied to the detector series 70, will cause the detectors 71 through 75 to be actuated, as their respective standard voltages of 3, 6, 9, 12, and 15 volts are all below the applied voltage of 17.1 volts. The detector 75 will then energize its lamp and thus indicate that the second most significant digit is 5.

The detector series 70, like the detector series 60, produces a D.C. output voltage equal to the highest standard voltage of the actuated detectors of the series. In the example, this output would be 15 volts and is applied to an input of an ×10 amplifier 24. The output from the amplifier 22 is also applied to the amplifier 24. The amplifier 24 amplifies by a factor of 10 the difference between the voltages applied from the detector series 70 and the amplifier 22 and applies its output to a detector series 80, comprised of 9 detectors, 81 through 89. This detector series is the same as the series 60 and 70 and produces an indication of the third most significant digit of the input signal. The detectors 81 through 89 indicate the numbers 1 through 9, respectively, and each detector has a different standard voltage, ranging from 3 volts to 27 volts, so that the standard voltage for each is three times the number that the detector indicates.

The voltage applied to the series 80 from amplifier 24 will actuate those detectors of the series 80 which have a standard voltage lower than the voltage applied from the amplifier 24 and each of the actuated detectors will remain actuated until the voltage applied from the amplifier 24 drops below the respective standard voltage of the detector, at which time the detector will become deactuated. The actuated detector having the highest standard voltage will energize a lamp to indicate the third most significant digit. In the above described example, 15 volts would be applied to the amplifier 24 from the detector series 70 and 17.1 volts would be applied from the amplifier 22, the difference being 2.1 volts. Accordingly, the output from the amplifier 24 would be 21 volts and when applied to the detector series 80 would cause the detectors 81 through 87 to be actuated. Hence, the detector 87 will energize its lamp and thus indicate the third most significant digit.

Actually, the system is designed to require that the input voltage slightly exceed the value that is to be indicated. For example, the detector 87 will not be actuated unless the voltage applied to the detector series 80 slightly exceeds 21 volts. Therefore, in order for the number 357 to be indicated, the input voltage to the system must slightly exceed 357 volts.

With the detector series 80 is a decimal shift circuit 90. The output voltage from the amplifier 24 is also applied to this circuit. If the output voltage from the amplifier 24 exceeds 30 volts, the decimal shift circuit 90 will be actuated and will apply a gating signal to an "and" gate 45. Each detector 69 and 79 in the series 60 and 70 also applies a gating signal to the "and" gate 45 whenever it is actuated. Whenever the "and" gate 45 receives gating signals from both of the detectors 69 and 79 and from the decimal shift circuit 90, simultaneously, the "and" gate will apply a switching signal to each of three bi-stable circuits 46, 47, and 48. This condition will occur when amplifier 20 produces an output voltage greater than 30 volts.

Each of the bi-stable circuits 46, 47, and 48 have two stable states, which shall be referred to as the first stable state and the second stable state. If the bi-stable circuit 46 is in its first stable state and it receives a switching signal from the "and" gate 45, it will be switched to its second stable state providing an output control signal, if it also receives a control signal from the detector 61. By design of the system the bi-stable circuit 46 cannot receive a signal from the "and" gate 45 unless it also receives a control signal from the detector 61. The detector 61 will apply a control signal to the bi-stable circuit 46 whenever it is actuated and will continue to apply a control signal to the bi-stable circuit 46 as long as it is actuated. The bi-stable circuit 46 will be switched from its second stable state to its first stable state when the detector 61 stops applying a control signal. As is explained above, the detector 61 will become deactuated whenever the voltage applied to the series 60 from the amplifier 20 drops below 3 volts.

When the amplifier 15 receives a control signal from the bi-stable circuit 46, it will attenuate its applied input voltage from the voltage divider 30 by a factor of 10. Thus, the voltage applied to the detector series 60, 70 and 80 from the amplifier 20 will be reduced by a factor of 10, and in this manner, the value indicated by the three detector series 60, 70 and 80 will have its decimal point shifted one place to the right.

The control signal output from the bi-stable circuit 46 is also applied to the bi-stable circuit 47. The switching signal from the "and" gate 45 will not cause the bi-stable circuit 47 to shift to its second stable state unless the bi-stable circuit 47 also receives a control signal from the bi-stable circuit 46. The timing is such that the "and" gate switching signal is cut off before the bi-stable circuit 47 can switch to its second stable state after the bi-stable circuit 46 switches to its second stable state. The "and" gate 45 will not put out a switching signal again until it again receives signals from detectors 69 and 79 and decimal shift circuit 90. The bi-stable circuit 47 also produces a control signal output when it is in its second stable state which is applied to the $\times 1/10$ amplifier 17 causing it to attenuate the input voltage from amplifier 16 by a factor of 10. The control signal output from the bi-stable circuit 47 is also applied to the bi-stable circuit 48. The output from the "and" gate 45 is also applied to the bi-stable circuit 48 in a suitable timed relation to prevent switching of bi-stable circuit 48 until signals are again received from detectors 69 and 79 and decimal shift circuit 90. The bi-stable circuit 48 will be switched to its second stable state only when the bi-stable circuit 47 is already in its second stable state and a signal is received from "and" gate 45. The bi-stable circuit 48 applies a control signal to the $\times 1/10$ amplifier 19 when it is in its second stable state to attenuate the voltage applied from the amplifier 18 by a factor of 10. The bi-stable circuits 47 and 48 will remain in their second stable states only as long as they receive the control signals from the bi-stable circuits 46 and 47, respectively, and as soon as one of them stops receiving a control signal it will switch back to its first stable state.

The actions of bi-stable circuits 46, 47, and 48 cause the output voltage of amplifier 20 to be reduced by a factor of 10, 100, and 1000, respectively.

In the example where 357 volts are applied to the system, all of the bi-stable circuits are initially in their first stable state so that none of the $\times 1/10$ amplifiers 15, 17, or 19 attenuate the input voltage. Since the output from the amplifier 20 would far exceed 30 volts, the bi-stable circuit 46 would be immediately switched to its second stable state applying a control signal to amplifier 15. The input voltage would now be attenuated by a factor of 10 but would still far exceed 30 volts. Thus, the bi-stable circuit 47 would be switched to its second stable state attenuating the input voltage by a factor of 100. The output from amplifier 20, however, would still exceed 30 volts by a substantial amount and hence, the bi-stable circuit 48 would be switched to its second stable state attenuating the input voltage by a factor of 1000. Thus, with 357 volts applied to the input of the system, an output from amplifier 20 of 10.71 volts would be obtained and the detector series 60, 70, and 80 would indicate 3, 5, and 7, respectively. Whenever the output voltage of the amplifier 20 falls below three volts, all of the bi-stable circuits, which are in their second stable states, will be switched to their first stable states. Immediately thereafter, depending upon the value of the input voltage, the bi-stable circuit 46 or both the bi-stable circuits 46 and 47 may be switched to their second stable states in order that the output voltage of the amplifier 20 is kept below 30 volts. In this manner the output voltage from amplifier 20 is kept between 3 and 30 volts for all input voltages ranging from 0.1 volt to 1000 volts.

The control signals produced by each of the bi-stable circuits 46, 47, and 48 are applied to a decimal lamp circuit which indicates which of the bi-stable circuits 46, 47, and 48 are in their second stable states, and thus, gives a visual indication of where the decimal point is in the value indicated by the system. If none of the bi-stable circuits 46, 47, and 48 are in their second stable states, then the voltage range is less than 1 volt. If only the bi-stable circuit 46 is in its second stable state, then the input voltage range is between 1 volt and 10 volts.

If only the bi-stable circuits 46 and 47 are in their second stable states, then the input voltage range is from 10 volts to 100 volts. If all three bi-stable circuits 46, 47, and 48 are in their second stable states, then the input voltage is greater than 100 volts.

*The Overall Circuit*

Figure 2:
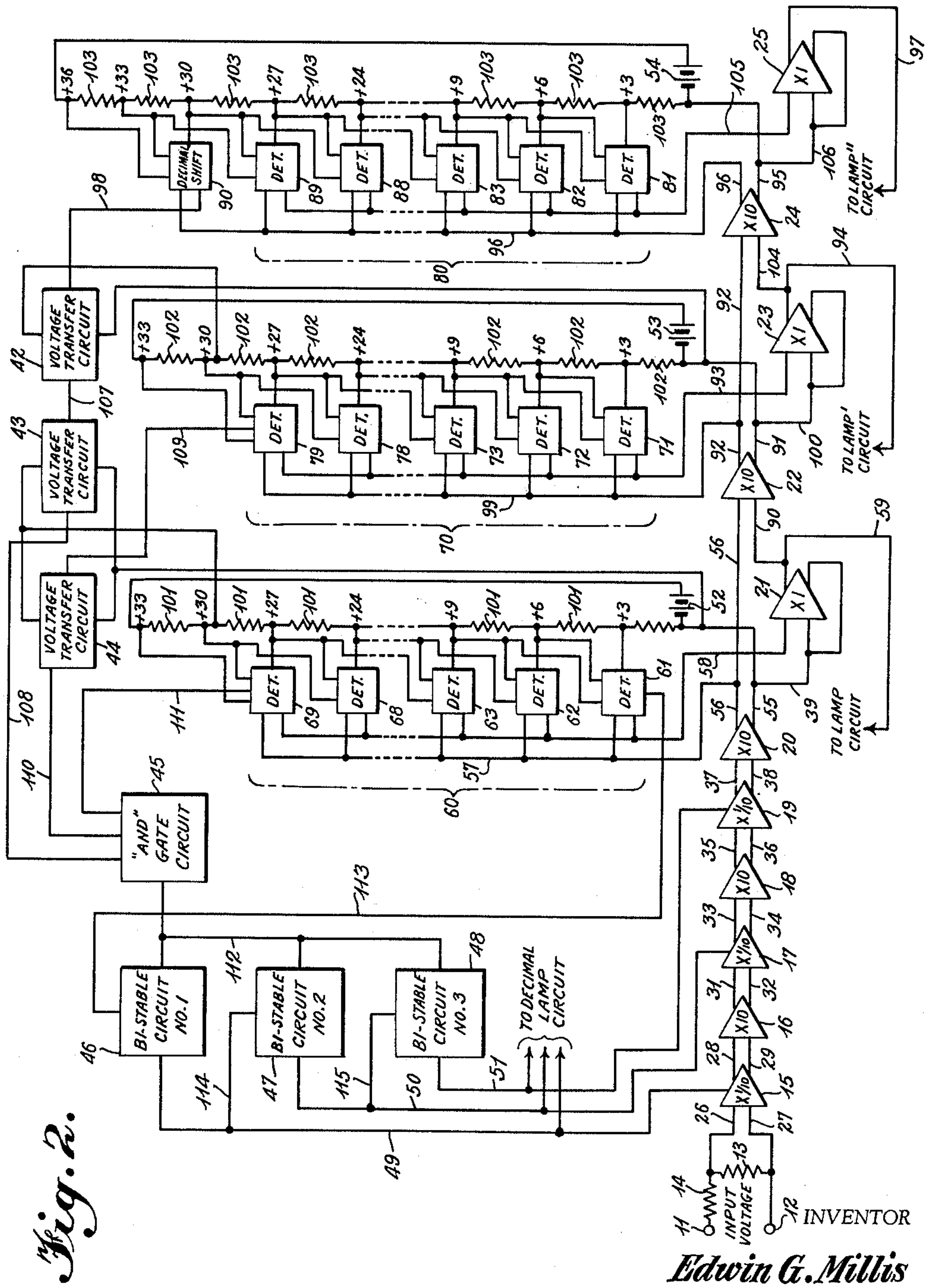
FIGURE 2 is a circuit diagram of the system of the invention illustrating how the operation is accomplished.

In the illustration of the circuit diagram of the system in FIGURE 2, the boxes and the triangles represent circuits which are shown in detail in FIGURES 3 through 10. In this circuit diagram the triangles either represent $\times 1/10$ amplifiers, $\times 10$ amplifiers, or $\times 1$ amplifiers. Each of these amplifiers has two inputs and two outputs to be designated signal and reference inputs and signal and reference outputs. Each $\times 1/10$ amplifier will produce a D.C. voltage between its signal and reference outputs, which is either $1/10$ of the D.C. voltage applied between its signal and reference inputs or equal to this voltage depending upon the application of a relatively high potential to its control input. Each $\times 10$ amplifier will produce a D.C. voltage between its signal and reference outputs 10 times the D.C. voltage applied between its signal and reference inputs. Each $\times 1$ amplifier will produce a D.C. voltage between its signal and reference outputs which is substantially equal to the D.C. voltage applied between its signal and reference inputs. In each of the $\times 1/10$, $\times 10$ and $\times 1$ amplifiers, the signal input and output will always be positive with respect to the reference input and output. The reference output in each is connected directly to the reference input so the potential levels will be exactly equal. The signal input of each amplifier is positioned above the reference input and, likewise, the signal output is positioned above the reference output.

The D.C. input signal voltage to the system, the value of which is to be converted to a digital number and indicated, is applied between a pair of terminals 11 and 12. The terminal 12 serves at a D.C. reference level and could be grounded. The positive side of the D.C. input voltage is applied to terminal 11 and the negative side to the reference terminal 12. The terminal 12 is connected directly to the reference input of the $\times 1/10$ amplifier 15 by means of a conductor 27. The terminal 11 is connected to the signal input of the amplifier 15 over a 5 megohm resistor 14 and a conductor 26. A resistor 13 connects the two conductors 26 and 27 together. The size of the resistor 13 is chosen so that the resistors 14 and 13 act together and attenuate the input voltage by a factor of $33\frac{1}{3}$, or in other words, multiply the voltage by a factor of $3/100$.

The signal output of the amplifier 15 is connected to the signal input of the $\times 10$ amplifier 16 by a conductor 28. A conductor 29 connects the reference output of the amplifier 15 to the reference input of the amplifier 16. A conductor 31 connects the signal output of the amplifier 16 to the signal input of the $\times 1/10$ amplifier 17. A conductor 32 connects the reference output of the amplifier 16 to the reference input of the amplifier 17. A conductor 33 connects the signal output of the amplifier 17 to the signal input of the $\times 10$ amplifier 18 and a conductor 34 connects the reference output of the amplifier 17 to the reference input of the amplifier 18. Conductors 35 and 36 connect the signal and reference outputs of the amplifier 18 to the signal and reference inputs of the $\times 1/10$ amplifier 19, respectively, and the conductors 37 and 38 connect the signal and reference outputs of the amplifier 19 to the signal and reference inputs of the $\times 10$ amplifier 20, respectively. A conductor 56 is connected to the signal output of the amplifier 20 and a conductor 55 is connected to the reference output of the amplifier 20. The D.C. voltage produced between the conductors 56 and 55 will either be $3/100$ of the input voltage applied between terminals 11 and 12. $3/10$ of it, 3 times it, or 30 times it depending upon the condition of the $\times 1/10$ amplifiers 15, 17, and 19. Since in each of the amplifiers 15 through 20, the reference input and output connection is maintained at the same potential level, the potential levels of conductors 55, 38, 36, 34, 32, 29, 27 and terminal 12 will all be equal.

The voltage between conductors 56 and 55 is applied via conductor 57 to the first series of detectors 61–69. The detectors are shown in block form in FIGURE 2 with some omitted for convenience, the detailed circuit of the detectors being illustrated in FIGURE 3. A conductor 58 is connected to the signal outputs of all the detectors of the first series.

The conductor 55 is connected to the negative terminal of a 33 volt battery 52. A series circuit of eleven resistors 101 (some are omitted in the drawing for convenience) connect the positive terminal of the battery 52 to the negative terminal thereof. The voltage divider comprised of resistors 101 produces 11 voltage outputs which range from 3 volts to 33 volts in steps of 3 volts. Since the conductor 55 is connected to the negative terminal of the battery 55, the potential level of the conductor 55 is the reference potential for the voltage divider of the resistors 101.

The 3, 6, 9, 12, 15, 18, 21, 24, and 27 volt outputs of the voltage divider are connected to the standard inputs of the detectors 61 through 69, respectively. Each detector of the series has a first bias input connected to a voltage output of the voltage divider of resistors 101 which is three volts higher than the voltage output connected to the standard input and has a second bias input connected to a voltage output which is six volts higher than the voltage output connected to the standard input.

A conductor 58 is connected to the signal output of each detector of the series 61–69 and to the signal input of a ×1 amplifier 21. A conductor 39 connects the conductor 55 to the reference input of the amplifier 21. The reference output of the amplifier 21 is connected to its reference input and a conductor 59 is connected to the signal output of the amplifier 21. The amplifier 21 is actually an emitter follower and serves to isolate the impedance between conductors 59 and 55 from that between conductors 58 and 55. The potential produced on conductor 59 will substantially equal the potential applied on conductor 58.

The voltage between the standard inputs of each of the detectors 61 through 69 and the conductor 55 provide the standard voltages for the detectors 61 through 69, respectively. Whenever the potential applied to the signal input of one of the detectors 61 through 69 exceeds the potential applied to the standard input of that detector, then that detector will be actuated. The detector series 61 through 69 produces an output potential on conductor 58, equal to the potential applied to the standard input of the actuated detector of the series 60 having the highest standard voltage. Therefore, the voltage produced between conductors 58 and 55 will equal the highest standard voltage of the actuated detectors in the series 60.

Each of the detectors 61–69 as an indicating lamp. The conductor 59 is connected to the energizing circuitry of the lamps of each of the detectors and the potential on the conductor 59 will block the energization of any lamp which is of a detector having a standard voltage less than the voltage between conductors 59 and 55. Hence, only the actuated detector which has the highest standard voltage will energize its lamp.

A conductor 40 connects the conductor 59 to the reference input of the ×10 amplifier 22. The conductor 56 is connected to the signal input of the amplifier 22. Conductors 92 and 91 are connected to the signal and reference outputs, respectively, of the amplifier 22 and produce a voltage between them which is substantially 10 times the voltage between conductors 56 and 40 and, hence, 10 times the voltage difference between the highest standard voltage of the actuated detectors of the series 61–69 and the voltage between conductors 56 and 55.

In the discussion of the amplification of the amplifiers 21 and 22 the word "substantially" has been used because the voltage output produced by an emitter follower, such as the amplifier 21, is slightly less than the voltage input. Therefore, the potential of the conductor 40 will be slightly less than the potential of the conductor 58 and the voltage difference between conductors 56 and 40 will be slightly greater than the voltage difference between conductors 58 and 56. In order to make the voltage produced between conductors 92 and 91 exactly equal to 10 times the difference between the highest standard voltage of the actuated detectors of the series 61–69 and the voltage between conductors 56 and 55, the amplification in amplifier 22 is made slightly less than 10.

The conductor 91 is connected directly to the negative terminal of a 33 volt battery 53. A conductor 99 connects the conductor 92 to the signal inputs of the second series of detectors 71–79.

A series of 11 equal resistors 102 connects the negative terminal of the battery 53 to the positive terminal thereof. The voltage divider comprised of resistors 102 has 11 outputs producing 11 voltages ranging from 3 volts to 33 volts in steps of 3 volts. Since the conductor 91 is connected to the negative terminal of the battery 53, the potential of the conductor 91 provides the reference level for the voltage divider of the resistors 102.

The outputs of the voltage divider of the resistors 102 are connected to the standard inputs, the first bias inputs, and the second bias inputs of the detectors 71–79 in exactly the same manner as the outputs from the voltage divider of resistors 101 are connected to the detectors 61–69. The detectors 71–79 operate just like the detectors 61–69. A conductor 93 is connected to the signal outputs of the detectors 71–79 and a voltage will be produced between conductors 93 and 91 equal to the highest standard voltage of the actuated detectors in the second series of detectors 71–79.

The conductor 93 is connected to the signal input of an ×1 amplifier 23. A conductor 100 connects the conductor 91 to the reference input of the amplifier 23, the reference output of which is connected to conductor 100. A conductor 94 is connected to the signal output of the amplifier 23. The amplifier 23 is an emitter follower just like the amplifier 21 and produces a potential on conductor 94 which is slightly less than the potential on conductor 93. The impedance between conductor 94 and conductor 91 is thus isolated from the impedance between conductors 93 and 91.

Each of the detectors 71–79, like the detectors 61–69, has a lamp which the detector tends to energize when it is actuated. The potential on line 94 blocks the energization of all the lamps which are of detectors having standard voltages lower than the voltage between conductors 94 and 91. Thus, only the actuated detector having the highest standard voltage will energize its lamp.

A conductor 104 connects the conductor 94 to the reference input of the ×10 amplifier 24. The conductor 92 is connected to the signal input of the amplifier 24. Conductors 96 and 95 are connected to the signal and reference outputs, respectively, of the amplifier 24. The amplifier 24 has an amplification factor of slightly less than 10 and will produce an output voltage between conductors 96 and 95 which is ten times the difference between the highest standard voltage of the actuated detectors in the second series 71–79 and the voltage between conductors 92 and 91.

The conductor 96 is connected to the signal inputs of the detectors 81–89 of the third series. The conductor 95 is connected to the negative terminal of a 36 volt battery 54. A series circuit of 12 equal resistors 103 is connected between the negative and positive terminals of the battery 54. The voltage divider comprised of resistors 33 has 12 outputs ranging in voltage from 3 volts to 36 volts in steps of 3 volts. Since the conductor 95 is connected to the negative terminal of the battery 54, its potential is the reference level for the voltage divider of resistors 103. The voltage outputs from 3 volts to 33 volts are connected to the standard inputs, the first bias inputs, and the second bias inputs of the detectors 81–89 in the same manner as the outputs from the voltage divider of resistors 101 is connected to the detectors 61–69. The detectors 81–89 operate just like the detectors 61–69. Whenever the voltage between conductors 96 and 95 exceeds the standard voltage of a detector, then that detector will be actuated.

A conductor 105 is connected to the signal outputs of the detectors 81–89. A voltage will be produced between conductors 105 and 95 equal to the highest standard voltage of the actuated detectors of the third series. The conductor 105 is connected to the signal input of an ×1 amplifier 25. A conductor 106 connects the conductor 95 to the reference input of the amplifier 25, the reference output of which is connected to the conductor 106. A conductor 97 is connected to the signal output of the amplifier 25. The amplifier 25 is an emitter follower just like the amplifier 21 and serves to isolate the impedance applied between conductors 97 and 95 from that applied between conductors 105 and 95. The potential produced on conductor 97 will be slightly less than the potential of conductor 105.

Each of the detectors of the third series 81–89 has a lamp. The conductor 97 is connected to the circuits for energizing the lamps of the series 80. The potential on conductor 97 will block the energization of the lamp of any detector which has a standard voltage of less than the voltage between conductor 97 and conductor 95. Hence, only the detector having the highest standard voltage of those actuated in third series 81–89 will energize its lamp.

Figure 4:
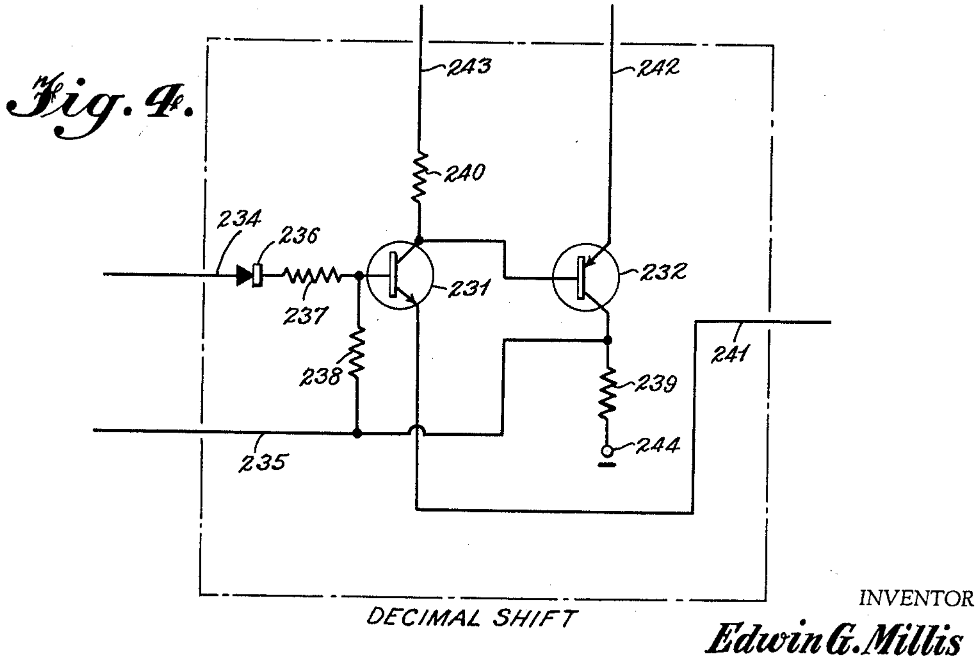
FIGURE 4 is a circuit diagram illustrating in detail the decimal shift circuit used in the system.

The conductor 96 is also connected to the signal input of the decimal shift circuit 90 which is shown in block form in FIGURE 2. The detailed circuit of the decimal shift circuit 90 is illustrated in FIGURE 4. The 30 volt output of the voltage divider of resistors 103 is connected to the standard input of the decimal shift circuit 90. The 33 volt output and the 36 volt output are connected to the first and second bias inputs, respectively of the decimal shift circuit and a conductor 98 is connected to the signal output of the decimal shift circuit. If the voltage between conductors 96 and 95 exceeds the 30 volts applied between the standard input of the decimal shift circuit 90 and the conductor 95, then the decimal shift circuit will be actuated and will produce a high output potential on conductor 98. This output potential will be about 32 volts higher than the potential of conductor 95. If the voltage between conductors 96 and 95 is less than 30 volts, the potential produced on conductor 98 will equal that of conductor 95.

The system utilizes three voltage transfer circuits 42, 43, and 44. Each of the transfer circuits has a signal input, a signal output, a first bias input and a second bias input. The voltage transfer circuits are shown in block form in FIGURE 2, the detailed circuitry being illustrated in FIGURE 8. The function of each voltage transfer circuit is to produce an output potential at its signal output which is equal to the potential applied to its second bias input, whenever the potential applied to the signal input is less than the potential applied to the first bias input; and to produce a potential at its signal output about equal to the potential applied to the signal input, whenever the potential applied to the signal input exceeds the potential applied to the first bias input. The conductor 98 is connected to the signal input of the voltage transfer circuit 42. The first bias input of the voltage transfer circuit 42 is connected to the 30 volt output of the voltage divider of the resistors 102. The second bias input is connected to the negative terminal of the battery 53. A conductor 107 is connected to the signal output of the voltage transfer circuit 42 and to the signal input of the voltage transfer circuit 43. The first and second bias inputs to transfer circuits 43 and 44 are connected directly to the 30 volt output of the voltage divider of the resistors 101 and the negative terminal of the battery 52, respectively. A conductor 108 is connected to the signal output of the voltage transfer circuit 43.

A conductor 109 connects a second signal output of the detector 79 to the signal input of the voltage transfer circuit 44. The signal output of the voltage transfer circuit 44 is connected to a conductor 110. The detector 79 will produce an output potential on conductor 109 about 30 volts higher than on conductor 91 in response to the detector 79 being actuated. When the detector 79 is not actuated the potential of conductor 110 will equal the potential of conductor 55.

A conductor 111 is connected to a second signal output of the detector 69. The detector 69 will produce an output potential on conductor 111 about 30 volts higher than the potential on conductor 55 in response to the detector 69 being actuated. When the detector 69 is not actuated, it will produce a potential on conductor 111 equal to that of conductor 55.

Figure 9:
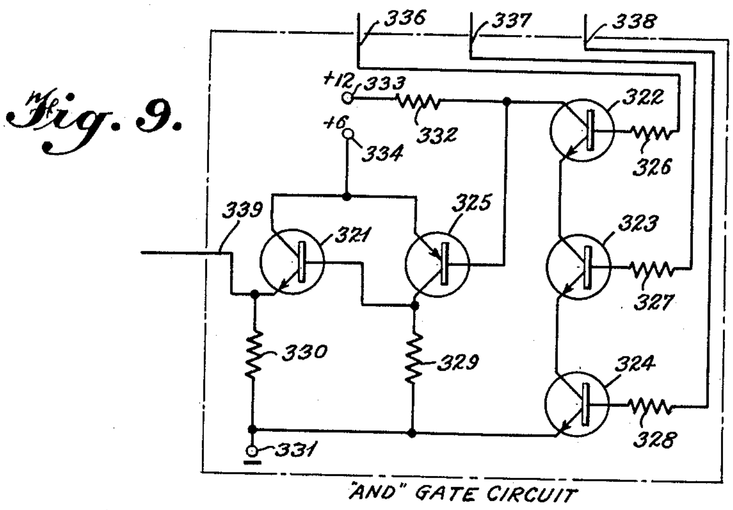
FIGURE 9 is a circuit diagram illustrating the detailed circuit of the "and" gate used by the system.

The conductors 108, 110, and 111 are connected to the first, second, and third signal inputs of the "and" gate 45 shown in block form in FIGURE 2, the detailed circuitry thereof being illustrated in FIGURE 9. A conductor 112 is connected to the signal output of the "and" gate 45. When the potentials on conductors 108, 110 and 111 are all substantially higher than the potential of the conductor 55, the "and" gate 45 will produce an output potential about 5 volts higher than the potential of conductor 55. When at least one of the potentials on conductors 108, 110, or 111 equals the potential of conductor 55 then the "and" gate 45 will produce an output potential on conductor 112 equal to the potential of conductor 55.

The purpose of the voltage transfer circuits will now be evident. The potentials produced on conductors 109 and 98 are too high to be applied directly to the signal inputs of the "and" gate 45. Indeed the conductor 98 may be as much as 54 volts higher than the potential of the conductor 55 when the decimal shift circuit 90 is not actuated. By means of the transfer circuits the potentials applied to the signal inputs of the "and" gate 45 are standardized and are either at a substantially higher potential than the potential of conductor 55 or at a potential equal to it. When more than 30 volts are produced between conductors 56 and 55, the conductors 108, 110, and 111 will all have potentials substantially higher than that of conductor 55. When the potential between conductors 56 and 55 is less than 30 volts, then at least one, and most likely all, of the conductors 108, 110, and 111, will have a potential equal to that of conductor 55. Thus, the "and" gate 45 will produce an output potential on conductor 112 about 5 volts higher than the potential of conductor 55 when and only when the decimal shift circuit 90, the detector 69, and the detector 79 are all three actuated. This circumstance will occur only when more than 30 volts is produced between conductors 56 and 55.

Figure 10:
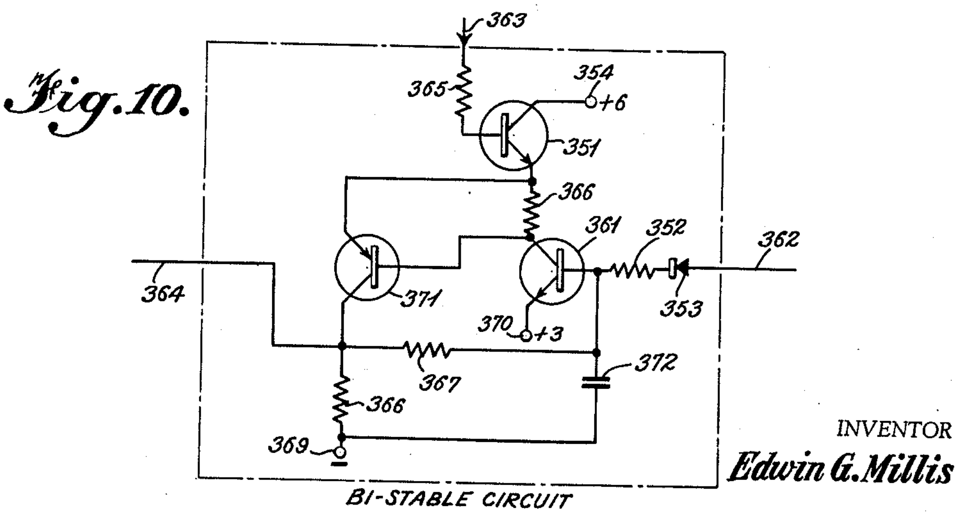
FIGURE 10 is a circuit diagram illustrating the detailed circuitry of the bi-stable circuits used by the system.

The conductor 112 is connected to the signal inputs of all three of the bi-stable circuits 46 through 48 shown in block form in FIGURE 2, the detailed circuit for each being shown in FIGURE 10.

A second signal output from the detector 61 is connected to the control input of the bi-stable circuit 46 by means of a conductor 113. Whenever the detector 61 is actuated, a potential about 6 volts higher than that of conductor 55 will be applied over conductor 113 to the control input of the bi-stable circuit 46. When the detector 61 is not actuated, the detector 61 will apply a potential to conductor 113 equal to that of conductor 55. When potentials around 5 or 6 volts higher than that of conductor 55 are applied to bi-stable circuit 46 over conductor 113 and conductor 112, it will switch from its first stable state to its second stable state and will remain in its second stable state even after the potential on conductor 112 drops to equal that on conductor 55. When the potential on conductor 113 drops down to equal that of conductor 55, the bi-stable circuit 46 will switch back to its first stable state.

A conductor 49 is connected to the signal output of the bi-stable circuit 46 and to the control input of the $\times 1/10$ amplifier 15. The bi-stable circuit 46 will produce a potential on conductor 49 about 5 volts higher than the potential of conductor 55 whenever it is in its second stable state, and it will produce a potential on conductor 49 equal to that of conductor 55 whenever it is in its first stable state. When a potential about 5 volts higher than the potential of conductor 55 is on conductor 49, it causes the $\times 1/10$ amplifier 15 to attenuate the voltage applied thereto between conductors 26 and 27 by a factor of 10. When the potential on conductor 49 equals that on conductor 55, the amplifier 15 will produce a voltage between conductors 28 and 29 equal to that applied between conductors 26 and 27.

A conductor 114 connects the conductor 49 to the control input of the bi-stable circuit 47. If the bi-stable circuit 47 is in its first stable state, and receives a potential on conductor 114 about 5 volts higher than the potential on conductor 55 by virtue of the bi-stable circuit 46 being in its second stable state, then a similar potential on conductor 112 produced by the "and" gate 45 will cause the bi-stable circuit 47 to switch to its second stable state. A conductor 50 connects the signal output of the bi-stable circuit 47 to the control input of the $\times 1/10$ amplifier 17. The bi-stable circuit 47 will produce a potential on conductor 50 about 5 volts higher than that of conductor 55 whenever it is in its second stable state, and it will produce a potential on conductor 50 equal to that of conductor 55 whenever it is in its first stable state. The potential produced on conductor 50 controls the amplifier 17 in the same manner as the potential on conductor 49 controls the amplifier 15.

A conductors 115 connects the conductor 50 to a control input of the bi-stable circuit 48. If the bi-stable circuit 48 is in its first stable state, and receives a potential applied from conductor 115 5 volts higher than that on conductor 55 by virtue of the bi-stable circuit 47 being in its second stable state, then a similar potential on the conductor 112 will switch it to its second stable state. A conductor 51 connects the output of the bi-stable circuit 48 to the control input of the $\times 1/10$ amplifier 19. The bi-stable circuit 48 will produce a potential on conductor 51 equal to that of conductor 55 whenever it is in its first stable state, and it will produce a potential on conductor 51 about 5 volts higher than that of conductor 55 whenever it is in its second stable state. The potential on conductor 51 controls the $\times 1/10$ amplifier 19 in the same manner as the potentials on conductors 49 and 50 control the amplifiers 15 and 17, respectively.

The bi-stable circuits 47 and 48 will remain in their second stable states as long as the potentials applied thereto on conductors 114 and 115, respectively, remain about 5 volts higher than the potential of conductor 55. When the potential on either one of these conductors changes to equal that of conductor 55, the respective bi-stable circuit will switch back to its first stable state. Thus, if the bi-stable circuit 46 switches back to its first stable state, the bi-stable circuit 47 will switch back to its first stable state and cause the bi-stable circuit 48 to switch back to its first stable state.

If none of the bi-stable circuits are in their second stable states and a voltage of between 1 volt and 10 volts is applied between terminals 11 and 12, a voltage of 30 volts or greater will be produced between conductors 56 and 55. The "and" gate 45 will therefore produce a potential on conductor 112 which is about 5 volts greater than the potential of conductor 55. A similar potential will likewise be produced on conductor 113. Hence, the bi-stable circuit 46 will switch to its second stable state. The bi-stable circuits 47 and 48 do not switch to their second stable states because the potential applied to the control inputs of the bi-stable circuits 47 and 48 will be equal to the potential of conductor 55. When the bi-stable circuit 46 switches to its second stable state, it will apply a potential to the control input of the bi-stable circuit 47 which would tend to make the bi-stable circuit 47 to switch to its second stable state. However, before the bi-stable circuit 47 switches to its second stable state, the output voltage between conductors 56 and 55 will be attenuated by a factor of 10, and hence will be less than 30 volts. Accordingly, the decimal shift circuit 90 will be deactuated and the "and" gate 45 will produce a potential on conductor 112 equal to that one conductor 55 before bi-stable circuit 47 can switch. To produce this result, the decimal shift circuit 90 is characterized by a considerably faster deactuation time than the switching time of the bi-stable circuit 47. Similarly, the bi-stable circuit 48 will not switch to its second stable state when the input voltage between terminals 11 and 12 is between 10 and 100 volts.

The conductors 49, 50 and 51 are connected to a decimal lamp circuit which indicates which, if any, of the bi-stable circuits 46, 47, and 48 are in their second stable states. Any conventional gating circuit could be used for the decimal lamp circuit so that the proper lamp of the decimal lamp circuits is energized by the potentials produced on conductors 49, 50 and 51. In this manner, a visual indication of the decimal place can be obtained.

*The Detector*

Figure 3:
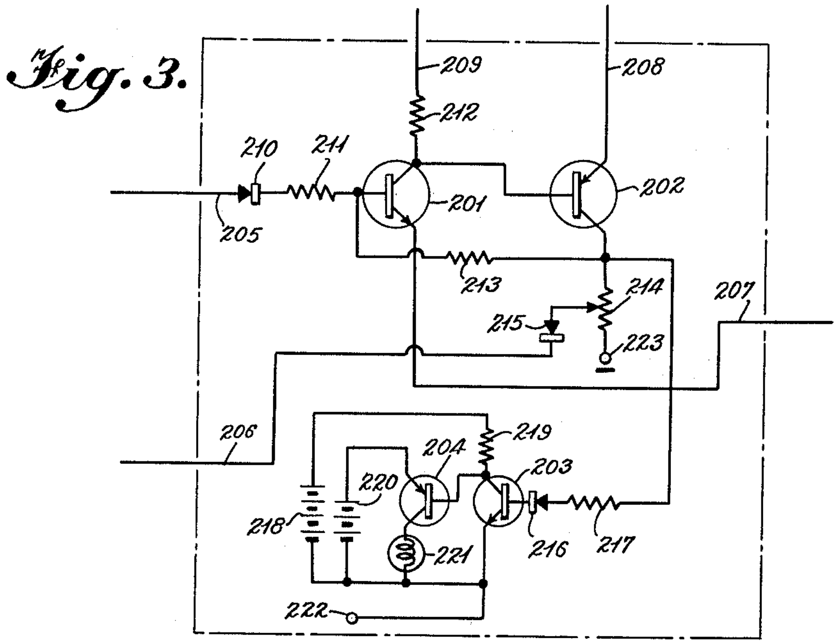
FIGURE 3 is a circuit diagram illustrating the detailed circuit for the detectors used in the system.

As shown in FIGURE 3 the circuit for each detector (61–69, 71–79, and 81–89) utilizes two NPN transistors 201 and 203 and two PNP transistors 202 and 204. The signal input is via conductor 205, the signal output via conductor 206, the standard input via conductor 207, and the first and second bias inputs via conductors 208 and 209, respectively. A rectifier 210 and a 33 kilohm resistor 211 form a series circuit to connect the signal input conductor 205 to the base of the NPN transistor 201. The standard input conductor 207 is connected directly to the emitter of the transistor 201. The second bias input conductor 209 is connected to the collector of transistor 201 over a 33 kilohm resistor 212. The collector of the transistor 201 is connected directly to the base of the PNP transistor 202. The emitter of the transistor 202 is connected directly to the first bias input conductor 208 and the collector of the transistor 202 is connected to the base of the transistor 201 by means of a resistor 213, the value of which will be between 0.5 and 10 megohms. A potentiometer 214 of about 50 kilohms has its end terminals connected in series between a terminal 223 and the collector of the transistor 202. A D.C. potential is applied to the terminal 223 by connecting the terminal 223 to the negative terminal of one of the batteries 52, 53, or 54. The terminals 223 of the detectors of the series 60 are connected to the battery 52, and the terminals 223 of the detectors of the series 70 and 80 are connected to the batteries 53 and 54, respectively. A D.C. voltage will therefore be applied between the first bias input conductor 208 and the terminal 223. The movable contact of the potentiometer 214 is connected to the signal output conductor 206 over a rectifier 215.

The base of the NPN transistor 203 is connected to the collector of the transistor 202 by the series circuit of a rectifier 216 and a 33 kilohm resistor 217. A 30 volt battery 218 has its positive terminal connected to the collector of the transistor 203 by means of a 10 kilohm resistor 219. The negative terminal of the battery 218 is connected to the emitter of the transistor 203. The collector of the transistor 203 is connected directly to the base of the PNP transistor 204. A 24 volt battery 220 has its positive terminal connected directly to the emitter of the transistor 204 and an indicating lamp 221 is connected between the negative terminal of the battery 220 and the collector of the transistor 204. The negative terminals of the batteries 220 and 218 are connected together. A terminal 222 is connected to the emitter of the transistor 203. The terminal 222 is connected to one of the conductors 59, 94 or 97 (shown in FIGURE 2), depending upon which series the detector is in. The terminals 222 of the detectors of the series 60 are connected to conductor 59, and those of the detectors of the series 70 and 80 are connected to conductors 94 and 97, respectively.

The standard voltage of each detector is the voltage between that on the standard input conductor 207 and that of terminal 223, since the terminal 223 and the respective one of conductors 55, 91, and 95 are both connected to the negative terminal of the respective one of the batteries 52, 53, and 54. The potential applied on the first bias input conductor 208 is three volts higher than the potential applied on the standard input conductor 207 and the potential applied on the second bias input conductor 209 is 6 volts higher than the potential applied on the standard input conductor 207.

When the potential applied on the signal input conductor 205 is below the potential applied to the standard input conductor 207, the transistor 201 will not conduct. As a result, no current will flow through the resistor 212 and the full potential at the second bias input conductor 209 will be applied to the base of the transistor 202. Since the potential applied to the emitter of the transistor 202 is 3 volts lower than this potential applied to the base of transistor 202, the transistor 202, being a PNP transistor, will be maintained non-conducting. Therefore, little current will flow through the potentiometer 214 and a low potential will be produced at the collector of the transistor 202 and at the movable contact of the potentiometer 214, both of which for all practical purposes will equal that of terminal 223. This low potential at the collector of the transistor 202 is applied to the base of the transistor 203 through the resistor 217 and the rectifier 216. As a result, the transistor 203 will not conduct and the collector potential of this transistor will be 30 volts higher than terminal 222. Thus, the base of the transistor 204 will be 30 volts higher than terminal 222 and, therefore, 6 volts higher than the emitter of the transistor 204. The transistor 204 will, therefore, be maintained in a non-conducting state and the lamp 221 will not be energized.

Now, when the potential applied on the signal input conductor 205 rises to a point above the potential applied on the standard input conductor 207, the transistor 201 will begin to conduct. This conduction will cause a decrease in the potential applied to the base of the transistor 202 and, thus, cause the transistor 202 to start to conduct. As the transistor 202 starts to conduct, it causes a rise in the collector potential of the transistor 202. This rise in potential is fed back to the base of the transistor 201 by the resistor 213 so that the transistor 201 goes to a fully conducting state and, likewise, the transistor 202 goes to a fully conducting state, as soon as the potential applied on the signal input conductor 205 rises above the potential applied on the standard input conductor 207. In this manner the detector is actuated.

When the potential applied on the signal input conductor 205 drops down below the potential applied on the standard input conductor 207, the transistor 201 will stop conducting and the transistor 202 will also stop conducting. In this manner the detector is deactuated.

The size of the resistor 213 is chosen small enough so that both transistors 201 and 202 are driven to full conduction whenever the potential at the signal input 205 exceeds that at the standard input 207, yet large enough to allow cut-off of both transistors 201 and 202 when the potential at the signal input 205 drops below that at the standard input 207. Thus, the actuation and deactuation of the detector circuit is made precise.

When the detector circuit is actuated, a potential approximately equal to that on the first bias input conductor 208 will be produced at the collector of the transistor 202. The movable contact of the potentiometer is adjusted so that the potential at conductor 206 (when disconnected) is exactly equal to the potential applied on the standard input conductor 207. This potential will be produced on the signal output conductor 206 when connected if the rectifier 215 is not blocked off. Because of rectifier 215 only the actuated detector having the highest standard voltage will produce an output potential on its signal output conductor 206 equal to the potential applied on its standard input conductor 207. In all other actuated detectors, rectifier 215 will be blocked off by the potential produced on the conductor 206 of the actuated detector having the highest standard voltage.

When the detector circuit is actuated, the potential at the collector of the transistor 202 will be applied to the base of the transistor 203 over the resistor 217 and the rectifier 216. If the potential applied to the base of transistor 203 is higher than the potential applied to the terminal 222, the transistor 203 will start conducting, causing a voltage drop through the resistor 219 and thus, causing the potential at the collector of the transistor 203 to drop. The drop in potential at the collector of the transistor 203 is applied to the base of the transistor 204, thus causing the transistor 204 to start conducting, and the lamp 221 will be energized. However, only that detector which has the highest standard voltage of the actuated detectors in the series energizes its lamp. This is because the terminal 222 of each detector is connected to one of the conductors 59, 94 or 97. In this manner, the potential at the terminal 222 of each detector is maintained about equal to the potential applied on the standard input conductor of the actuated detector having the highest standard voltage. If the potential applied to terminal 222 is higher than the potential applied on the standard input conductor 207, then, even though the detector circuit is actuated, the lamp 221 will not be energized because the potential applied to the emitter of the transistor 203 from the terminal 222 will be higher than the potential applied to the base of the transistor 203 from the collector of the transistor 202. Therefore, the transistor 203 will not conduct, the transistor 204 will not conduct, and the lamp 221 will not be energized.

A second signal output, which only the detectors 61, 69 and 79 have, and to which the conductors 113, 111, and 109, respectively, are connected, is obtained by a direct connection to the collector of transistor 202. This connection is not illustrated in FIGURE 3 as the majority of the detectors do not use a second signal output. When the detector circuit is actuated, the collector of the transistor 202 will have a potential about equal to the potential of the first bias input conductor 208. Therefore, the conductor 113 will have a potential about 6 volts higher than the conductor 55 when the detector 61 is actuated, the conductor 111 will have a potential about 30 volts higher than the conductor 55 when the detector 69 is actuated, and the conductor 109 will have a potential about 30 volts higher than the conductor 91 when the detector 79 is actuated.

*The Decimal Shift Circuit*

As shown in FIGURE 4, the decimal shift circuit, designated by the number 90 in FIGURE 2, employs a PNP transistor 232 and an NPN transistor 231. This circuit is similar to the circuit shown in FIGURE 3, but uses no lamp circuit, and so, it is necessary to employ only two transistors. The signal input is via conductor 234, the signal output is via conductor 235, the standard input is via conductor 241 and the first and second bias inputs are via conductors 242 and 243, respectively. The signal input conductor 234 is connected to the base of the NPN transistor 231 over a rectifier 236 and a 33 kilohm resistor 237 connected in series. The emitter of the transistor 231 is connected to the standard input conductor 241. The collector of the transistor 231 is connected to the second bias input conductor 243 over a resistor 240. The collector of the transistor 231 is also connected directly to the base of the PNP transistor 232, the emitter of which is connected directly to the first bias input conductor 242. The collector of the transistor 232 is connected to a terminal 244 by means of a 33 kilohm resistor 239. A D.C. potential is applied to terminal 244 by connecting it to the negative terminal of the battery 54 (shown in FIGURE 2). The collector of the transistor 232 is also connected to the signal output conductor 235. A resistor 238 having a value between 0.5 and 10 megohms connects the base of the transistor 231 to the collector of the transistor 232. As is explained with reference to FIGURE 2, the standard input conductor 241 is connected to the 30 volt output of the voltage divider of resistors 103 and the first and second bias input conductors 242 and 243 are connected to the 33 and 36 volt outputs, respectively of the voltage divider of resistors 103. A D.C. voltage of 33 volts will therefore be applied between the first bias input conductor 242 and the terminal 244.

When the potential applied on the signal input conductor 234 is lower than the potential applied to the emitter of the transistor 231 on the standard input conductor 241, the transistor 231 will not conduct. This condition, in turn, will maintain the transistor 232 non-conducting by means of the direct connection from the collector of the transistor 231 to the base of the transistor 232. Accordingly, the output potential from the collector of the transistor 232 will be relatively low, and for all practical purposes equal to the potential of the terminal 244. When the potential on the signal input conductor 234 rises above the potential applied on the standard input conductor 241, the transistor 231 will begin to conduct producing a voltage drop through the resistor 240. The transistor 232 will now also begin to conduct and its collector potential will rise. This rise will be transmitted to the base of transistor 231 which further increases the conduction through transistor 231. In this manner, the transistors 231 and 232 are driven to full conduction whenever the potential applied on the signal input conductor 234 exceeds the potential applied on the standard input conductor 241, and thereby, the decimal shift circuit is actuated.

When the potential applied on the signal input conductor 234 drops below the potential applied to the emitter of the transistor 231 from the standard input conductor 241, the transistor 231 will stop conducting, and likewise, the transistor 232 will also stop conducting. In this manner the decimal shift circuit is deactuated.

The resistor 238 provides a positive feedback from the collector of the transistor 232 to the base of the transistor 231. This resistor, like the resistor 213 of the circuit in FIGURE 3, is chosen to be of a size to provide an accurate comparison point between the potential applied on the standard input conductor 241 and the potential applied on the signal input conductor 234. If the resistor 238 is properly chosen, the transistors 231 and 232 will be driven to a full on condition as soon as the potential applied on the signal input conductor 234 exceeds the potential applied on the standard input conductor 241, and likewise, when the potential on the signal input conductor 234 drops down below the potential applied on the standard input conductor 241, the transistor 231 and 232 will be precisely cut off. Thus, the decimal shift circuit will be actuated and deactuated with precision.

When the circuit is actuated, the current will flow through the transistor 232 with much less than a 1 volt drop, so the output potential applied on the signal output conductor 235 will be about equal to the potential applied on the first bias input conductor 242, or in other words, about 33 volts higher than the potential of conductor 95 (shown in FIGURE 2). When the decimal shift circuit is not actuated, no current will flow through the transistor 232 and little current will flow through the resistor 239. Hence, the potential applied on the signal output conductor 235 will, for all practical purposes, be equal to that of the terminal 244, and hence equal to the potential of conductor 95 (shown in FIGURE 2).

*The ×1/10 Amplifier*

Figures 5, 6, 7:
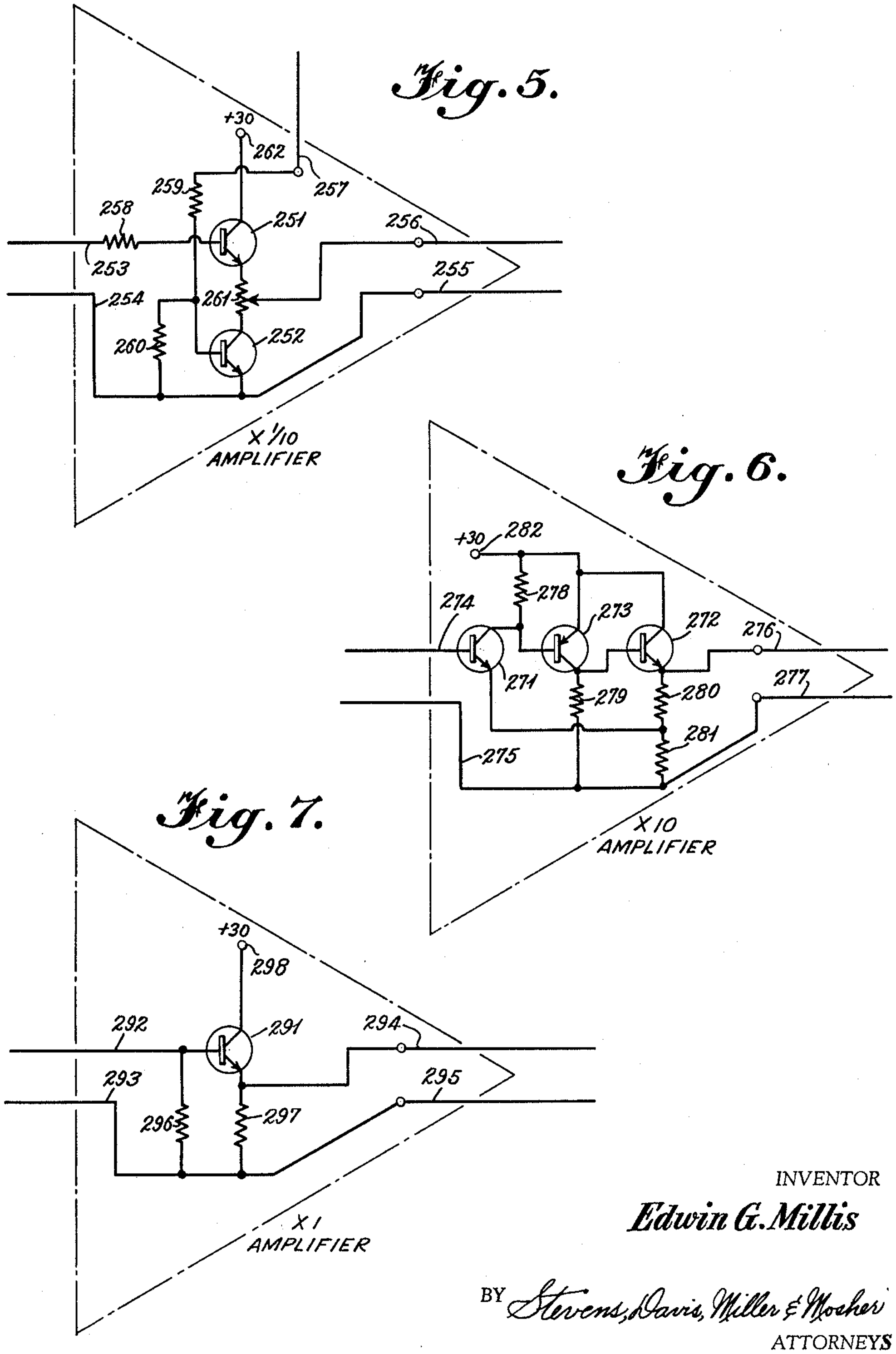
FIGURE 5 is a circuit diagram illustrating the detailed circuit of the system's $\times\frac{1}{10}$ amplifiers, which will produce an output voltage either equal to the input voltage or equal to a predetermined fraction thereof.
FIGURE 6 is a circuit diagram illustrating the detailed circuit of the $\times 10$ amplifiers used by the system.
FIGURE 7 is a circuit diagram illustrating the detailed circuit of the $\times 1$ amplifiers used by the system.

As shown in FIGURE 5, the circuit for the ×1/10 amplifiers 15, 17 and 19 employs two NPN transistors 251 and 252. The signal input is via conductor 253, the signal output is via conductor 256, the reference input is via conductor 254, the reference output is via conductor 255, and the control input is via conductor 257. The signal input conductor 253 is connected to the base of the transistor 251 by means of a 33 kilohm resistor 258. The collector of the transistor 251 is connected to a terminal 262. The emitter of the transistor 251 is connected to the collector of the transistor 252 by means of a 10 kilohm potentiometer 261. The movable contact of the potentiometer 261 is connected directly to the signal output conductor 256. The emitter of the transistor 252 is connected directly to both the reference input conductor 254 and the reference output conductor 255. The base of the transistor 252 is connected to the emitter of the transistor 252 by means of a 33 kilohm resistor 260. The control input conductor 257 is connected to the base of the transistor 252 by means of a 33 kilohm resistor 259. As was explained with reference to FIGURE 2, the potential of the reference input and output conductors of all the ×1/10 amplifiers equals that of conductor 55. A voltage of 30 volts is applied to the circuit shown in FIGURE 5 between the terminal 262 and the reference input and output conductors by connecting the terminal 262 to the 30 volt output of the voltage divider of resistors 101.

The ×1/10 amplifier either produces a voltage between the signal and reference output conductors 256 and 255 equal to the voltage applied between the signal and reference input conductors 253 and 254 or equal to 1/10 of it depending upon the potential applied on the control input conductor 257. As explained with reference to FIGURE 2, the potential applied to the control input conductors of the ×1/10 amplifiers will either be about 5 volts higher than the potential of conductor 55 or equal to it. When the potential on the control input conductor 257 equals that of conductor 55, the potential of the base of transistor 252 will equal the potential of its emitter. When the potential on the control input conductor is 5 volts higher than the potential of the conductor 55, the potential of the base of transistor 252 will be higher than the potential of its emitter.

If the potential of the base of transistor 252 equals that of its emitter, then the transistor 252 will not conduct and will constitute an open circuit in the emitter circuit of the transistor 251. An output potential will therefore be produced on the movable contact of the potentiometer 261 equal to the potential applied on the signal input conductor 253. Thus, the voltage produced between the signal and reference output conductors 256 and 255 will equal the voltage applied between the signal and reference input conductors 253 and 254. When the potential at the base of transistor 252 is greater than that at its emitter, the transistor 252 will conduct. This will effect a low resistance in the emitter circuit of the transistor 251 and cause current to flow from the emitter of the transistor 251 through the potentiometer 261 and the transistor 252. Hence, a voltage drop will occur from the emitter of the transistor 251 to the movable contact of the potentiometer 261. The effect of this action will be to produce an output voltage between the signal and reference output conductors 256 and 255 which is 1/10 of the voltage applied between the signal and reference input conductors 253 and 254. The movable contact of the potentiometer 261 can be adjusted so that the output voltage is exactly 1/10 of the input voltage.

*The X10 Amplifier*

As shown in FIGURE 6, the circuit for the X10 amplifiers 16, 18, 20, 22 and 24 employs two NPN transistors 271 and 272 and one PNP transistor 273. The signal input is via conductor 274, the signal output is via conductor 276, the reference input is via conductor 275, and the reference output is via conductor 277. The signal input conductor 274 is connected directly to the base of the NPN transistor 271. The collector of the transistor 271 is connected to a terminal 282 by means of a 10 kilohm resistor 278. The collector of the transistor 271 is also connected to the base of PNP transistor 273. The emitter of the transistor 273 is connected directly to the terminal 282, and the collector of the transistor 273 is connected to the reference input conductor 275 by means of 33 kilohm resistor 279. The collector of the transistor 273 is also directly connected to the base of the NPN transistor 272. The collector of the transistor 272 is connected directly to the terminal 282. The emitter of the transistor 272 is connected to the reference input conductor 275 by means of the series circuit comprising resistors 280 and 281. The values of the resistors 280 and 281 are approximately 9 kilohms and 1 kilohm, respectively. The emitter of the transistor 271 is connected directly to the junction of the resistors 280 and 281. The signal output conductor 276 is connected directly to the emitter of the transistor 272. The reference input conductor 275 is connected directly to the reference output conductor 277. Thirty volts are applied between the terminal 282 and the reference input and output conductors 275 and 277. The amplifiers 16, 18 and 20 have their terminals 282 connected to the 30 volt output of the voltage divider of resistors 101, while the amplifiers 22 and 24 have their terminals 282 connected to the 30 volt output of the voltage dividers of resistors 102 and 103, respectively.

The voltage applied between the signal and reference input conductors 274 and 275 will be amplified by the two transistors 271 and 273, and applied between the reference input conductor 275 and the base of the transistor 272, which operates as an emitter follower and produces an output voltage 10 times the input voltage between the signal and reference output conductors 276 and 277. By connecting the emitter of the transistor 271 to the junction of the resistors 280 and 281, a negative feedback is provided from the output of the amplifier to the input of the amplifier. By properly choosing relative value of the resistors 280 and 281, the voltage output between the signal and reference output conductors 276 and 277 can be made precisely 10 times the voltage input between the signal and reference input conductors 274 and 275. As explained with reference to FIGURE 2, it is necessary for the amplifiers 22 and 24 to have amplification factors of slightly less than 10. This result can also be achieved by choosing the proper values for the resistors 280 and 281.

*The X1 Amplifier*

As shown in FIGURE 7, the circuit for the X1 amplifiers 21, 23, and 25 employs a single NPN transistor 291. The signal input is via conductor 292, the reference input is via conductor 293, the signal output is via conductor 294, and the reference output is via conductor 295. The reference input conductor 293 is connected directly to the reference output conductor 295. The signal input conductor 292 is connected directly to the base of the transistor 291. The collector of the transistor 291 is connected directly to a terminal 298. In the amplifier 21, this terminal 298 will be connected to the 30 volt output of the voltage divider comprising the resistors 101 (see FIGURE 2). In the amplifier 23, the terminal 298 will be connected directly to the 30 volt output of the voltage divider comprising the resistors 102. In the amplifier 25, the terminal 298 will be connected to the 30 volt output of the voltage divider comprising the resistors 103. In this manner, 30 volts are applied between the terminal 298 and the reference input and output conductors 293 and 295. The emitter of the transistor 291 is connected to the reference input and output conductors 293 and 295 by means of a 10 kilohm resistor 297. The base of the transistor 291 is connected to the reference input and output conductors 293 and 295 by means of a 100 kilohm resistor 296. The emitter of the transistor 291 is also connected to the signal output conductor 294.

The above described circuit comprises an emitter follower and the voltage applied between the signal and reference input conductors 292 and 293 will be reproduced between the signal and reference output conductors 294 and 295 with its amplitude substantially unchanged. Actually the amplitude will be slightly reduced because in emitter follower amplifiers the amplification factor is between 0.99 and 1.0 for high gain transistors.

*The Voltage Transfer Circuit*

Figure 8:
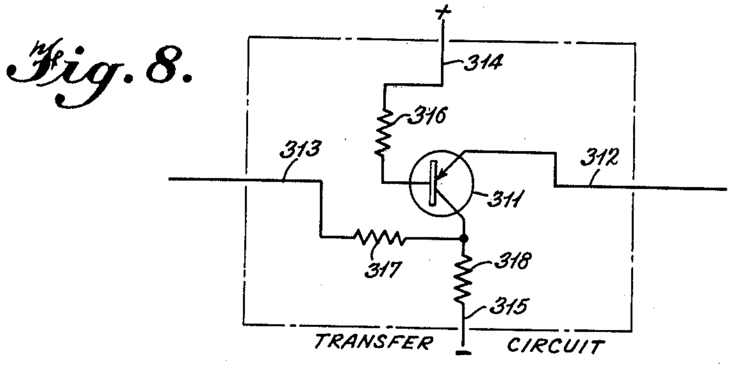
FIGURE 8 is a circuit diagram illustrating the detailed circuitry of the voltage transfer circuits used by the system.

As shown in FIGURE 8, the circuitry for the voltage transfer circuits 42, 43, and 44 comprises a single PNP transistor 311. The signal input is via conductor 312, the signal output is via conductor 313, the first bias input is via conductor 314, and the second bias input is via conductor 315. The signal input conductor 312 is connected directly to the emitter of the transistor 311. The base of the transistor 311 is connected to the first bias input conductor 314 by means of a 33 kilohm resistor 316. The collector of the transistor 311 is connected to the second bias input conductor 315 by means of a 33 kilohm resistor 318. The collector of the transistor 311 is also connected to the signal output conductor 313 by means of a 33 kilohm resistor 317.

The function of the voltage transfer circuit is to produce an output potential at the signal output conductor 313 in response to an input potential applied on the signal input conductor 312. The output potential is to be substantially the same as the input potential when the input potential exceeds the potential applied on the first bias input conductor 314. When the input potential is below the potential applied on the first bias input conductor 314, the voltage transfer circuit produces an output potential equal to the potential applied on the second bias input conductor 315. As can be seen from FIGURE 2, the potential applied on the first bias input conductor 314 is 30 volts greater than the potential applied on the second bias input conductor 315, for all of the voltage transfer circuits.

When the input potential exceeds the potential applied to the first bias input conductor 314, the transistor 311 will conduct. This produces a potential at the collector of the transistor 311 substantially the same as the input potential. When the input potential drops below that applied on the first bias input conductor 314, the transistor 311 will not conduct and no current will flow through the resistor 318. Therefore, the collector potential of the transistor 311 will equal that on the second bias input conductor 315. The collector potential of the transistor 311 is applied on the signal output conductor 313 over the resistor 317.

*The "And" Gate*

As shown in FIGURE 9, the circuit for the "and" gate 45 employs 4 NPN transistors 321 through 324 and 1 PNP transistor 325. The first, second and third signal inputs and the signal output are introduced via conductors 336, 337, 338 and 339, respectively. The first signal input is connected to the base of the NPN transistor 322 by means of a 33 kilohm resistor 326. The second signal input is connected to the base of the transistor 323 by means of a 33 kilohm resistor 327 and the third signal input is connected to the base of the NPN transistor 324 by means of a 33 kilohm resistor 328. The collector of the transistor 322 is connected to a terminal 333 by means of a 33 kilohm resistor 332. The emitter of the transistor 322 is connected directly to the collector of the transistor 323, the emitter of which is connected directly to the collector of the transistor 324. The emitter of the transistor 324 is connected directly to a terminal 331. A D.C. voltage of 12 volts is applied between terminals 333 and 331. To obtain this voltage the terminal 331 is connected to the conductor 55, which is connected to the negative side of the battery 52 (see FIGURE 2), and the terminal 333 is connected to the 12 volt output of the voltage divider of resistors 101. The collector of the transistor 322 is connected directly to the base of the PNP transistor 325. The emitter of the transistor 325 is connected directly to a terminal 334. A D.C. voltage of 6 volts is applied between terminals 334 and 331. To obtain this voltage the terminal 334 is connected to the 6 volt output of the voltage divider of resistors 101. The collector of the transistor 325 is connected to the terminal 331 by means of a 33 kilohm resistor 329. The collector of the transistor 325 is also connected to the base of the NPN transistor 321. The collector of the transistor 321 is connected to the terminal 334 and the emitter of the transistor 321 is conneced to the terminal 331 by means of a 10 kilohm resistor 330. The emitter of the transistor 321 is connected directly to the signal output conductor 339.

If potentials substantially higher than the potential of terminal 331 are applied to all the signal inputs, then all of the transistors 322, 323, and 324 will conduct. This action will cause a substantial potential drop through the resistor 332 and cause the potential applied to the base of the transistor 325 to drop below the potential of terminal 334. Therefore, the transistor 325 will conduct and the potential at the collector of the transistor 325 will rise above the potential of terminal 331. The potential on the collector of the transistor 325 will be applied to the base of the transistor 321, and therefore, transistor 321 will conduct, resulting in a potential substantially higher than that of the terminal 331 being produced at the emitter of the transistor 321. This potential is applied on the signal ouput conductor 339.

If any one of the signal inputs has a potential applied thereto which is equal to the potential of the terminal 331, then the transistor to which the signal input is connected, will no longer conduct. For example, if the signal input conductor 337 has a potential equal to that of the terminal 331, the transistor 323 will not conduct due to the low potential applied to the base of this transistor. If one or more of the transistors 322, 323, or 324 are not conducting, an open circuit will exist between the collector of the transistor 322 and the emitter of the transistor 324. Therefore, the collector potential of the transistor 322 will be above the potential applied to terminal 334 and transistor 325 will not conduct. Thus, the collector potential of the transistor 325 will equal that of terminal 331. This potential at the collector of the transistor 325 will prevent the transistor 321 from conducting and in this condition, the emitter potential of transistor 321 will equal that of terminal 331. This low potential will then be produced on the signal output conductor 339. The terminal 331, being connected to the conductor 55 has a potential equal to the conductor 55. Therefore, if one or more of the signal inputs is at a potential equal to the potential of conductor 55, the signal output on conductor 339 will also be equal to the potential of the conductor 55. When potentials substantially higher than that of conductor 55 are applied to all three signal inputs, these potentials will be substantially higher than the potential of conductor 55. Under these circumstances, the potential drop through transistor 321 will be less than a volt and accordingly, the potential produced at the signal output conductor 339 will be about 5 volts higher than the potential of the conductor 55.

*The Bi-Stable Circuit*

The circuit for the bi-stable circuits 46, 47 and 48 is shown in FIGURE 10 and employs two NPN transistors 351 and 361 and 1 PNP transistor 371. The signal input, the signal output, and the control input are introduced via conductors 362, 364, and 363, respectively. The signal input conductor 362 is connected to the base of the NPN transistor 361 through a series circuit of a rectifier 353 and a 33 kilohm resistor 352. The emitter of the transistor 361 is connected to a terminal 370. The collector of the transistor 361 is connected to the emitter of the NPN transistor 351 by means of a 10 kilohm resistor 366. The collector of the transistor 351 is connected to a terminal 352. Three volts are applied to the circuit between terminals 354 and 370. To obtain this 3 volts the terminal 354 is connected to the 6 volt output of the voltage divider of resistor 101 (shown in FIGURE 2) and the terminal 370 is connected to the 3 volt output of the voltage divider of resistor 101. The base of the transistor 351 is connected to the control input conductor 363 by means of a 33 kilohm resistor 365. The collector of the transistor 361 is connected directly to the base of the PNP transistor 371. The emitter of the transistor 371 is connected directly to the emitter of the transistor 351. The collector of the transistor 371 is connected to a terminal 369 by means of a 10 kilohm resistor 368. Six volts are applied to the circuit between terminals 354 and 369. To obtain this 6 volts, the terminal 369 is connected to the conductor 55, which is connected to the negative terminal of the battery 52. A 100 kilohm resistor 367 connects the collector of the transistor 371 to the base of the transistor 361. The collector of the transistor 371 is connected directly to the signal output conductor 364. A 0.1 microfarad capacitor 372 connects the base of the transistor 361 to the terminal 369.

When the bi-stable circuit is in its first stable state, the transistors 371 and 361 will not be conducting. When the bi-stable circuit is in its second stable state, both of the transistors 371 and 361 will be conducting. When the bi-stable circuit is in its first stable state, no current will flow through the resistor 368, so an output potential will be produced at the signal output conductor 364 equal to the potential of the terminal 369 and the conductor 55. When the bi-stable circuit is in its second stable state, the voltage drop through the transistors 351 and 371 will be less than a volt, and therefore, the output potential produced at the signal output conductor 364 will be about 5 volts higher than the potential of terminal 369 and conductor 55.

Now if the bi-stable circuit is in its first stable state and if a potential substantially higher than the potential of terminal 370 should be applied over the control input conductor 363, the admittance through the transistor 351 would be substantially increased. Still no current would flow through the transistors 371 and 361 due to the feedback connection via resistor 367, so the bi-stable circuit would still remain in its first stable state. If, while a potential substantially higher than that at terminal 370 is applied over the control input conductor 363, a similar potential is applied over the signal input conductor 362, the transistor 361 will begin to conduct. Current will then flow from the terminal 354 through the transistor 351, through the resistor 366 and through the transistor 361 to the terminal 370. The current flowing through the resistor 366 will cause a potential drop at the collector of the transistor 361. This drop in potential will be applied to the base of the transistor 371 which will then have a lower potential than the emitter of the transistor 371 and the transistor 371 will begin to conduct. When current starts to flow through the transistor 371, current will flow through the resistor 368 causing a rise in the collector potential of the transistor 371. This rise in collector potential of the transistor 371 is applied back to the base of the transistor 361 by means of the resistor 367 which causes a further increase in the conduction through the transistor 361. The action is thus cumulative and the result is that the transistors 371 and 361 are switched to a condition where full current is flowing through both. This condition will remain even after the potential applied over the signal input conductor 362 drops down to equal that of terminal 369, because the feedback resistor 367 will maintain a relatively high potential at the base of transistor 361, the collector of which in turn will maintain a relatively low potential at the base of the transistor 371. When the transistors 371 and 361 are switched so that they are both conducting with full current flowing, the bi-stable circuit will be in its second stable state.

Should the potential applied over the control input conductor 363 drop to equal that of terminal 369, current will stop flowing through the transistor 351 and this action will stop conduction through both the transistors 361 and 371. Thus, the bi-stable circuit will be switched back to its first stable state. In the operation of the system the potential applied to the control input and the signal input of each of the bi-stable circuits will always be about 5 volts higher than or equal to that of the conductor 55 (shown in FIGURE 2), which is connected to the terminal 369. The bi-stable circuit will switch to its second stable state from its first stable state only when the potentials applied at both the control input and the signal input are about 5 volts higher than the conductor 55, and it will remain in its second stable state and will not switch back to its first stable state until the potential applied to the control input changes to equal that of conductor 55.

This bi-stable circuit is similar to the circuit used in the detectors, as shown in FIGURE 3, and in the decimal shift circuit, as shown in FIGURE 4, except that the size of the feedback resistor 367 is much smaller than the feedback resistor 213 used in the circuit of FIGURE 3, and the feedback resistor 238 used in the circuit of FIGURE 4. The smaller feedback resistor used in FIGURE 10 makes the circuit bi-stable, as it brings out a regenerative action when the circuit is switched from its first stable state to its second stable state since the circuit will maintain itself in its second stable state even without the potential applied from the signal input.

As was stated in the discussion with reference to FIGURE 2, the time it takes the bi-stable circuit to switch from its first stable state to its second stable state must be substantially greater than the time necessary for the decimal shift circuit to become deactuated. This result will be obtained because the capacitor 372 slows down the switching action of the bi-stable circuit.

It will be observed that when the middle significant digit indicated by the digital voltmeter is zero, none of the detectors 71 through 79 will be actuated. On such an occurrence it is important that the potential on conductor 104 almost precisely equal that of conductor 91 so that the amplifier 24 will amplify the correct difference voltage. The voltage produced between conductors 92 and 91 will be between zero and three volts. This voltage will be applied between the input conductors 205 and the terminals 223 of each of the detectors 71 through 79. This voltage will cause a small amount of current flow through the resistors 211, 213 and 214 of each of the detectors 71 through 79. As a result, a potential will be produced on the conductors 206 of each of the detectors 71 through 79 and this potential will appear on conductor 93. Because the resistor 213 has an impedance much greater than that of the potentiometer 214, the potential produced on conductor 93 will practically equal that of conductor 91. Therefore, the potential of conductor 104 will almost precisely equal that of conductor 91 when none of the detectors 71 through 79 are actuated.

The same circuit operation takes place in the detector series 60 when none of the detectors 61 through 69 are actuated. The only time none of the detectors 60 will be actuated, however, will be when the input voltage is below 0.1 volt. This is below the normal range of the digital voltmeter which is from 0.1 to 1000 volts.

The above described device is a preferred embodiment of the invention and can be modified without departing from the spirit and scope of the invention. For example: additional series of detectors could be used if more than three significant digits are desired; likewise, less than three series of detectors are required, if less than three significant digits are desired; the system can be modified to convert the input signal into a binary number, ternary number, or a number of any other number system; any controllable non-linear impedance such as vacuum tubes could be used instead of most of the transistors of the circuit; the system could be modified to convert to digital form, other analogue values of an input signal, such as frequency; and instead of, or in addition to, giving a visual indication of the detected digital number, the system could be modified to transmit the digital number to other apparatus, such as a computer. These and many other modifications are deemed to come within the spirit and scope of the invention which is to be limited only as defined in the appended claims.

What is claimed is:

1. An analogue to digital converter comprising a first series of detecting means, a second series of detecting means, a third series of detecting means, each of the detecting means of each of said first, second, and third series detecting whether the value of an applied signal exceeds a predetermined standard value, the standard value of each of said detecting means of any one series of said first, second, or third series being different from each other, a source of input signal, circuit means for applying the input signal from said source of input signal to all of the detecting means of said first series, first amplifying means for amplifying the difference between the value of said input signal and the highest standard value of said first series exceeded by the value of said input signal, circuit means for applying the amplified signal amplified by said first amplifying means to said second series of detecting means, second amplifying means for amplifying the difference between the value of the signal applied to said second series of detecting means and the highest standard value in said second series exceeded by the value of the signal applied to said second series, and circuit means for applying the amplified signal amplified by said second amplifying means to said third series of detecting means.

2. An analogue to digital converter as recited in claim 1 wherein there is included a comparing means for comparing the value of an applied signal to a standard value, circuit means to apply the amplified signal amplified by said second amplifying means to said comparing means, and means to attenuate said input signal applied to said first series of detectors by a predetermined factor in response to the value of the signal applied to said first series of detectors exceeding the standard value of a predetermined detector in said first series, the value of the signal applied to said second series exceeding the standard value of a predetermined detector in said second series, and the value of the signal applied to said comparing means exceeding the standard value of said comparing means simultaneously.

3. An analogue to digital converter comprising a series of detecting means, each detecting whether the value of an applied signal exceeds a predetermined standard value, each standard value for each detecting means being different from each other, each of said detecting means having an output means to produce an output signal, said output signal having a value equal to the standard value of the respective detecting means having the output means producing said output signal, each of said output means producing its output signal responsive to the value of the applied signal exceeding the standard value of the respective detecting means, circuit means for applying an input signal to all of the detecting means of said series, means for selecting from said series an output signal, the value of which is the greatest, means for amplifying the difference between the value of the said signal selected by said selecting means and the value of said input signal, further means for detecting the value of an applied signal, and circuit means for applying the amplified difference signal from said amplifying means to said further detecting means.

4. An analogue to digital converter comprising a series of detecting means, each detecting whether the amplitude of an applied signal exceeds a predetermined standard amplitude, each standard amplitude for each detecting means being different from each other, each of said detecting means having an output means to produce an output signal having a standard amplitude for the respective detecting means, each of said output means producing its output signal responsive to the amplitude of the applied signal exceeding the standard amplitude for the respective detecting means, first circuit means for applying an input signal to all of the detecting means of said series, second circuit means connecting the output signals from each of said output means into a single output, a plurality of rectifying means, one connected between the output of each of said output means and said circuit means, means for amplifying the difference in amplitude between the signal from said single output of said second circuit means and said input signal, further detecting means for detecting the amplitude of an applied signal, and means to apply the signal amplified by said amplifying means to said further detecting means.

References Cited in the file of this patent

UNITED STATES PATENTS

| | | |
|---|---|---|
| 2,606,943 | Barker | Aug. 12, 1952 |
| 2,625,822 | Nichols | Jan. 20, 1953 |
| 2,661,260 | Salzman | Dec. 1, 1953 |
| 2,715,718 | Holtje | Aug. 16, 1955 |
| 2,747,028 | Clark | May 22, 1956 |
| 2,775,754 | Sink | Dec. 25, 1956 |
| 2,783,453 | Rose | Feb. 26, 1957 |
| 2,784,396 | Kaiser et al. | Mar. 5, 1957 |
| 2,794,077 | Olson | May 28, 1957 |
| 2,865,000 | Newell | Dec. 15, 1958 |
| 2,870,408 | Draganjac | Jan. 20, 1959 |
| 2,872,670 | Dickinson | Feb. 3, 1959 |
| 2,896,198 | Bennett | July 21, 1959 |
| 2,981,107 | Anderson | Apr. 25, 1961 |
| 3,005,156 | Hoberman | Oct. 17, 1961 |

OTHER REFERENCES

Publication I, Notes on Analog-Digital Conversion Techniques, by A. K. Susskind, Technology Press of M.I.T. 1957, pages 5–56 to 5–60.

Publication II, An Unusual Analog Digital Conversion Method, by B. D. Smith, I.R.E. Transactions on Instrumentation, June 1956, pp. 155–160.